(12) United States Patent
Lumbard (10) Patent No.: US 7,358,526 B2
(45) Date of Patent: Apr. 15, 2008

(54) OLED SEPARATING STRUCTURES

(75) Inventor: Marvin Alan Lumbard, Los Gatos, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 108 days.

(21) Appl. No.: 11/238,333

(22) Filed: Sep. 28, 2005

(65) Prior Publication Data

US 2007/0069200 A1   Mar. 29, 2007

(51) Int. Cl.
*H01L 29/08* (2006.01)

(52) U.S. Cl. .................. 257/40; 438/99; 257/E51.018; 257/E51.019

(58) Field of Classification Search ................. 438/99; 257/40, E51.018, E51.019
See application file for complete search history.

(56) References Cited

U.S. PATENT DOCUMENTS

| | | | | |
|---|---|---|---|---|
| 5,962,970 A | * | 10/1999 | Yokoi et al. | 313/506 |
| 6,630,785 B1 | * | 10/2003 | Lu | 313/505 |
| 6,781,162 B2 | * | 8/2004 | Yamazaki et al. | 257/184 |
| 2004/0104385 A1 | | 6/2004 | Lim et al. | |
| 2005/0242719 A1 | * | 11/2005 | Park | 313/504 |

FOREIGN PATENT DOCUMENTS

JP   2000294371   10/2000

* cited by examiner

*Primary Examiner*—Trung Dang
(74) *Attorney, Agent, or Firm*—Fish & Richardson P.C.

(57) ABSTRACT

Techniques are described for forming a separating structure on an OLED device that is free from deformation. The separating structure prevents adjacent electrodes from contacting one another.

28 Claims, 9 Drawing Sheets

OLED SEPARATING STRUCTURES

BACKGROUND

Figure 1:
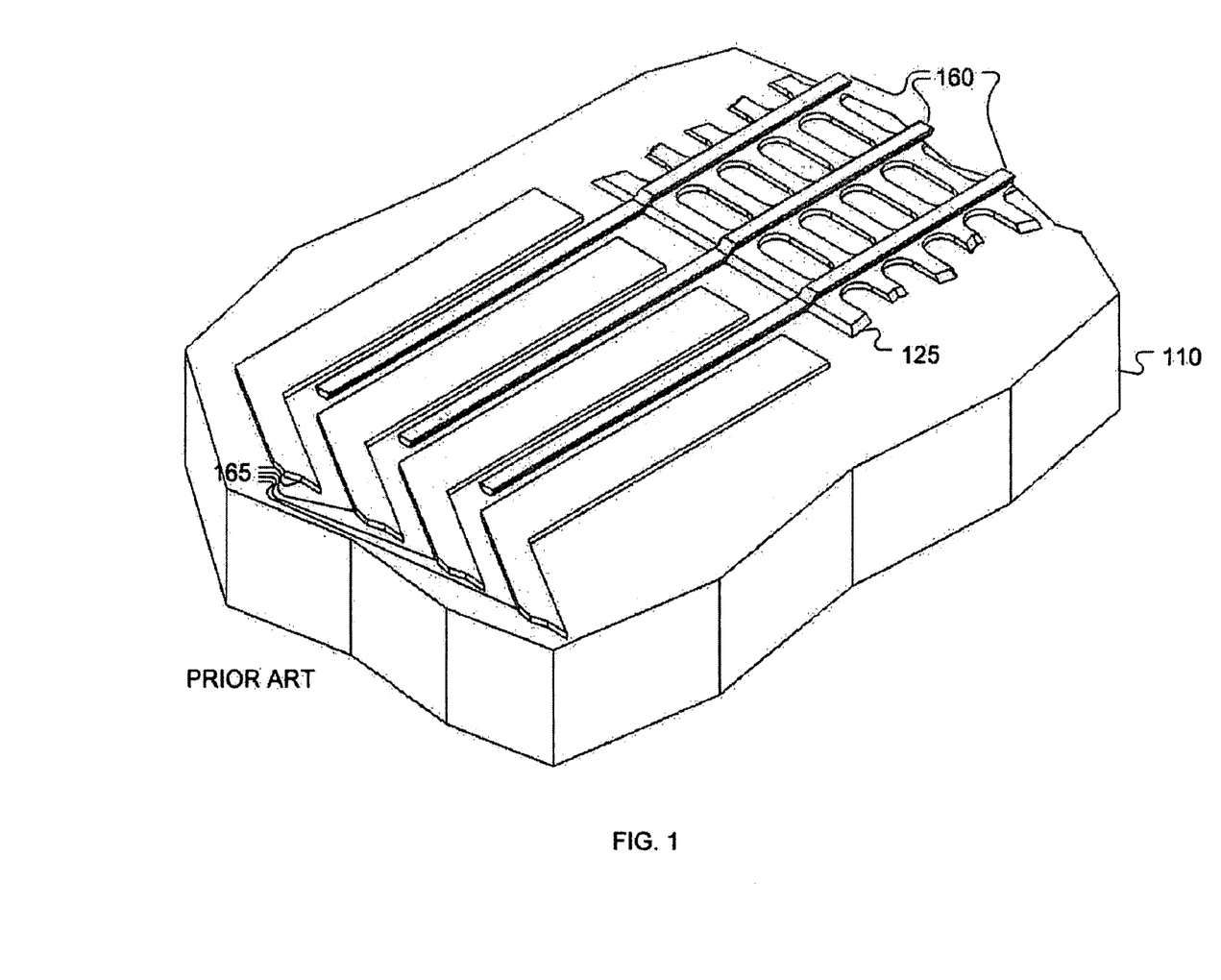
FIG. 1 is a perspective view of a portion of a partially complete OLED device.

This invention relates to the architecture of organic light emitting diode devices. Organic light emitting diodes (OLEDs) form light emitting pixels of an OLED device. Referring to FIG. 1, the pixels are formed on a substrate 110, such as a transparent layer of material, for example, glass or plastic. Lower electrodes, such as anodes (not shown), are supported by the substrate 110. The anodes can be formed of a conductive material, such as indium-tin-oxide (ITO). In some types of OLED devices, a pocket layer 125 is formed over the anodes. The pocket structure is typically a layer having apertures or pockets for retaining organic layers (not shown). Each pocket may correspond to an individual pixel of an OLED device. The organic layers, which are layers of conjugated polymers or small-molecules, are deposited into the pockets over the anode. Typically, there are at least two organic layers, a conductive layer and a light emitting layer in each pocket. Other organic layers can also be formed. Upper electrodes, such as cathodes (not shown), sandwich the organic layers with the lower electrodes. The cathodes can be formed of a conductive material, such as a low work function metal, e.g., calcium, barium or aluminum, or a salt, such as lithium fluoride, or a combination thereof. An anode, a cathode and the organic layers therebetween form a pixel.

Figure 2:
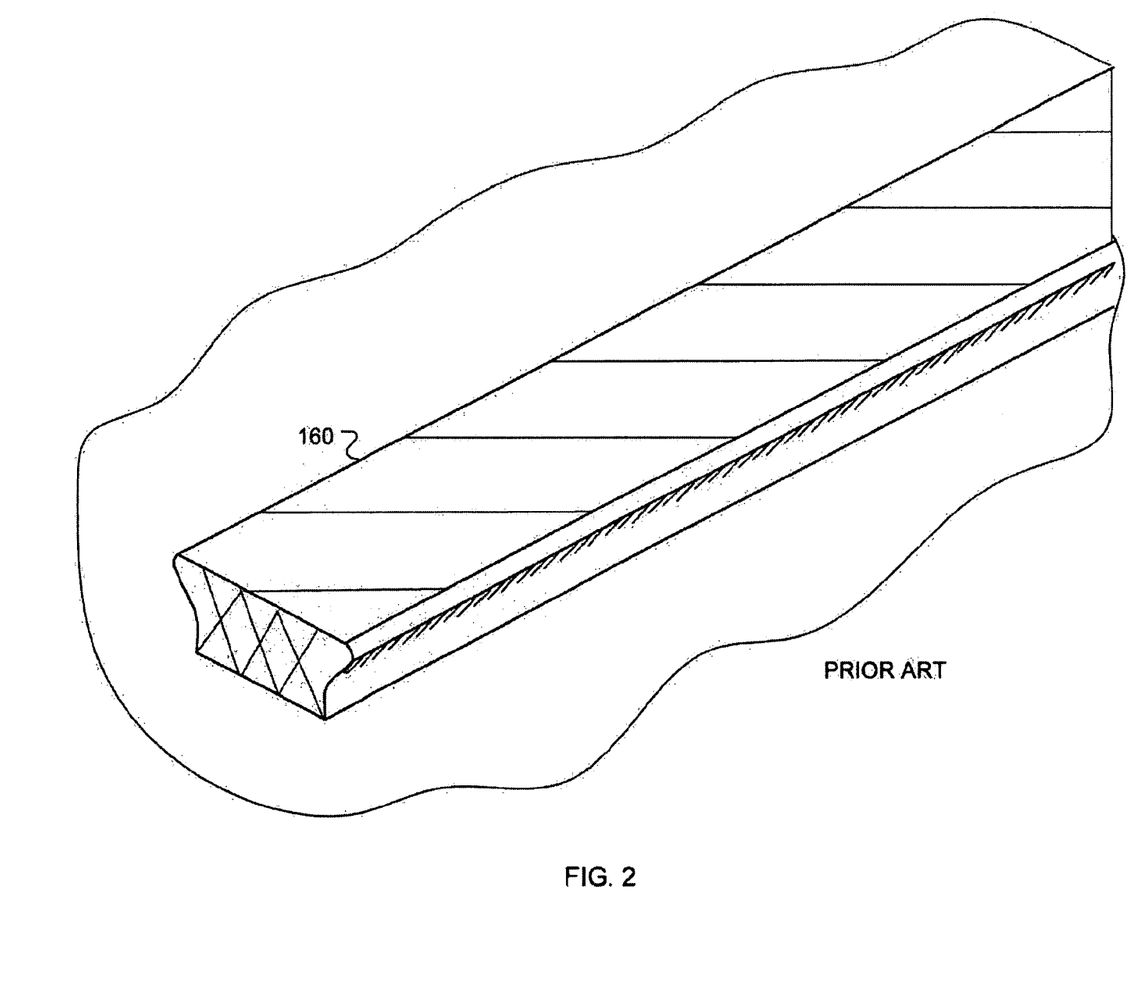
FIG. 2 is a perspective view of a separating structure from the OLED device of FIG. 1.

The OLED device can also include separating structures that act as a shadow structure for forming independent cathodes. Many structuring techniques that might otherwise be used to form individual cathodes, such as metal etching, can adversely affect the organic layers. Therefore, other techniques for ensuring separation between adjacent cathodes are often used. One such technique includes forming pillars or separating structures 160 on the substrate 110 prior to depositing the cathode metal. The cathode metal is applied so that a cathode overlaps one or more pixels and a cathode contact 165. As shown in FIG. 2, the separating structures 160 have a profile that is wider at the top than at the bottom. When the cathode metal is applied, such as by vapor deposition, the metal is deposited between the separating structures 160, forming electrodes, and on top of the separating structures 160. Because the tops of the separating structures 160 shadow the sides from deposited metal, the metal between the pillars 160 cannot contact the metal on top of the pillars.

Figure 3:
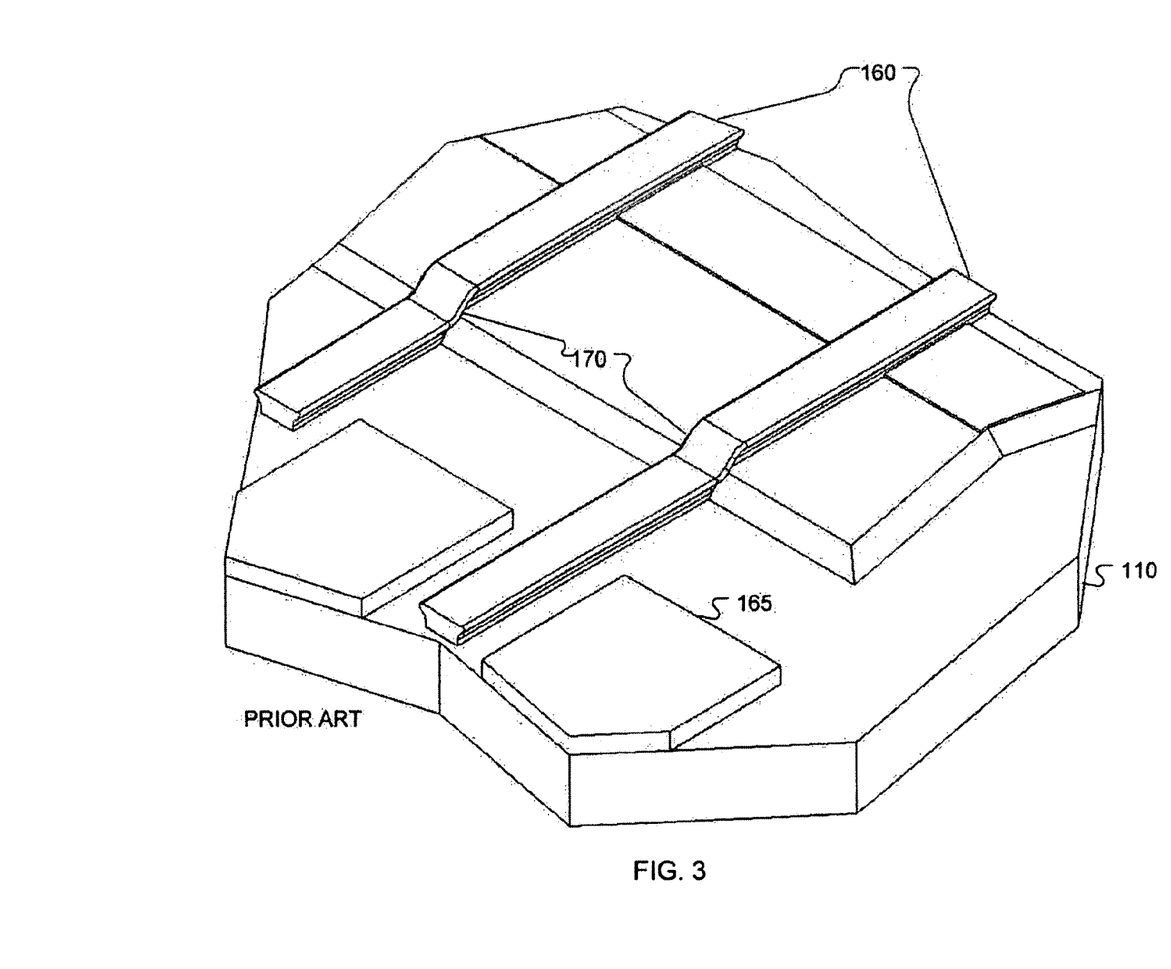
FIG. 3 is a perspective view of an OLED device showing separating structures that have a deformed area.

Referring to FIG. 3, one potential problem posed by using separating structures 160 is if the separating structures 160 deform, such as due to lack of structural integrity or the separating structures 160 having been applied to an uneven surface, the shadowing function of the separating structures 160 may be lost. For example, when the metal layer is deposited over a deformed area 170 of a separating structure 160, a contiguous layer of metal may be formed over the deformed area 170 as well as the adjacent electrodes, thereby electrically connecting two adjacent electrodes across the top of the deformed area 170. When multiple electrodes are connected to one another, the electrodes may no longer be individually addressable or the device can short circuit.

Separating structures can provide for a more accurate placement of the electrodes than a shadow mask. Thus, an improved separating structure can be preferred over other methods of forming electrodes, such as etching or using a mask. However, as described above, there are potential problems with using a separating structure, particularly if the structure fails to perform the job of separating adjacent electrodes from one another. Accordingly, what is needed is a method of forming a device so that the electrodes can be formed and maintained as separate electrodes.

SUMMARY

Aspects of the invention include a separating structure that is free of deformed areas caused by the separating structure being applied to an uneven surface of an OLED device. An organic light emitting diode device can include a substrate, a first layer on the substrate, a plurality of first electrodes, one or more organic layers and a plurality of second electrodes. The plurality of second electrodes extend in a first direction. A plurality of separating structures are on the first layer. A profile of a separating structure is narrower at a portion proximal to the first layer than a portion distal to the first layer. The separating structures extend in the first direction and separate one second electrode from an adjacent second electrode. The separating structures and the first layer extend beyond ends of the second electrodes.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Organic light emitting diode devices are described. In some aspects, the device has a substrate, a first layer on the substrate, first electrodes on the substrate and one or more organic layers on the first electrodes. The first electrodes extend in a first direction. Second electrodes are on the organic layers and extend in a second direction. Separating structures are on the first layer. A separating structure has a profile that is narrower at a portion proximal to the first layer than a portion distal to the first layer. When the substrate is a bottom layer, the distal portion is a top portion of the separating structure and the proximal portion is a bottom portion of the structure. The separating structures extend in the second direction and separate one second electrode from an adjacent second electrode. The separating structures and the first layer extend beyond ends of the second electrodes.

Implementations of the device can include one or more of the following features. The device can have second electrode contacts and the separating structure can extend between two second electrode contacts. The first layer can include pockets in which the organic layers are formed. The first layer can be a planarizing layer. The device can include filter material between the organic layers and the substrate. The first layer can prevent the separating structures from having deformed portions. The first layer can extend at least as far as the plurality of separating structures in the second direction. The first layer can include a photoresist. The separating structures can include a photoresist. The first layer can be between the substrate and the first electrodes or the first electrodes can be between the substrate and the first layer. The separating structures can be linear.

In some aspects, methods of forming an organic light emitting diode device are described. A first layer including a plurality of finger portions extending in a direction is formed on a substrate. First electrodes are formed on the substrate. One or more layers of organic material are deposited on the plurality of first electrodes. A plurality of separating structures are formed on the first layer, the separating structures having a bottom portion adjacent to the first layer and a top portion that is wider than the bottom portion. Second electrodes are formed over the one or more layers of organic material, the second electrodes extending in the direction. At least one of the second electrodes is between two separating structures and the finger portions extend beyond ends of the plurality of second electrodes.

The method can include steps that form a device having one or more of the features described above. Portions of the device, such as the second electrodes, can be formed using a shadow mask.

In some aspects, an organic light emitting diode device includes a substrate, a first layer on the substrate, first electrodes on the substrate, one or more organic layers on the first electrodes and second electrodes on the organic layers. The second electrodes have ends. Separating structures are on the first layer. A profile of the separating structures is narrower at a portion proximal to the first layer than a portion distal to the first layer, and the separating structures extend in the direction and separate one second electrode from an adjacent second electrode. A metal layer is on the separating structures. At least a portion of a bottom of each separating structure is substantially planar along a length of the separating structure. The portion with the substantially planar bottom extends at least past ends of the second electrodes so that the separating layer prevents adjacent second electrodes from contacting one another or a second electrode from contacting metal on at least one of separating structures.

Figure 4A:
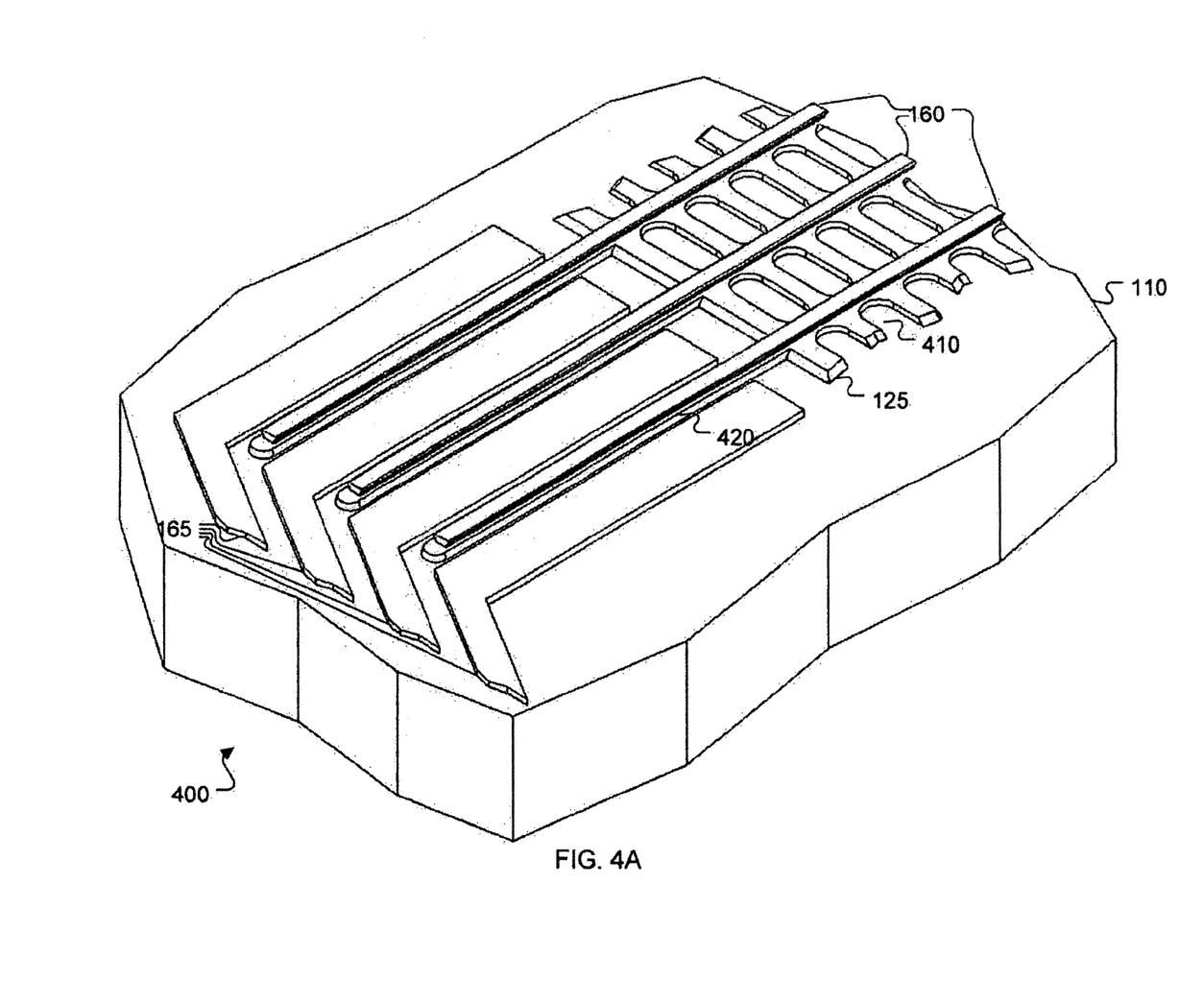
FIG. 4A is a perspective view of an OLED device showing separating structures that have no deformed areas.

Referring to FIG. 4A, an organic light emitting diode (OLED) device 400 has a substrate 110, a first layer, where in this example the first layer is a pocket layer 125, organic layers (not shown) within pockets 410 of the pocket layer 125, a first set of electrodes (not shown) beneath the pocket layer 125, contacts 165 for a second set of electrodes, and separating structures 160 to separate individual electrodes of the second set of electrodes. In some implementations, the first set of electrodes are anodes and the second set of electrodes are cathodes. In these implementation, the contacts 165 are cathode contacts. In some implementations, the first set of electrodes are cathodes and the second set of electrodes are anodes.

In accordance with at least one embodiment of the invention, the separating structures 160 are supported along their entire length by fingers 420 of the pocket layer 125. The fingers 420 extend between the contacts 165. In some implementations, the fingers 420 avoid contacting the contacts 165. In these implementations, the finger 420 is not much wider than the separating structure 160, only about 20 microns wider then the separating structure. If the fingers 420 overlap the cathode contact 165, the separating structure 160 can climb up the edge of the cathode contact 165, deforming the separating structure. In other embodiments, the finger 420 is wider, such as 70 or 80 microns wider, then the separating structure, and overlap between a finger 420 and a contact 165 may not adversely affect the profile of the separating structure 160. Generally, when the separating structures 160 are supported by the pocket layer 125, the likelihood of a separating structure 160 having a deformed area due to an uneven surface below the separating structure 160 is less than if the separating structure extends over an end of the pocket layer 125. That is, the separating structures 160 lack deformities due to a transition from the pocket layer 125 to the substrate 110 under the deposited conductive material.

Figure 4B:
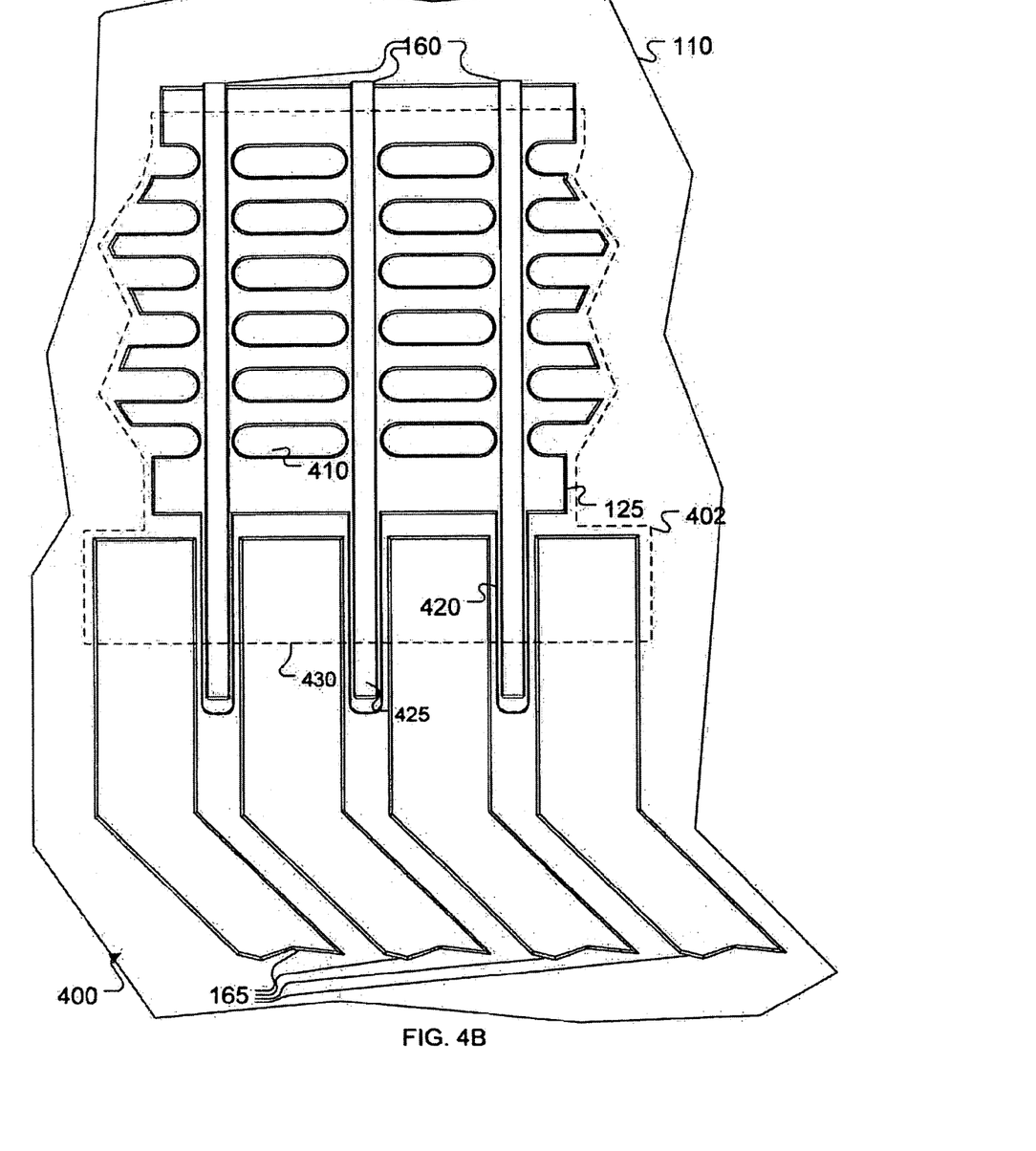
FIG. 4B is a plan view of an OLED device showing the location of metal to be deposited to form an upper set of electrodes.

Referring to FIG. 4B, the OLED device 400 of FIG. 4A has a conductive material deposited on the organic layers to form the second electrodes within a location represented by dashed line 402. The pocket layer 125 extends in the direction of the separating structures 160 past the edge of the deposited conductive material. In the implementation shown, the pocket layer 125 extends past ends 425 of the separating structures 160. In some implementations, the pocket layer 125 extends past the edge 430 of the deposited conductive material, but not past ends 425 of the separating structures 160. In some implementations, the fingers stop at the edge 430 of the deposited conductive material. Importantly, the layers underneath the separating structures 160 provide a flat surface for forming the separating structure 160. The separating structures 160 are on a flat or level surface at least to the edge 430 of the second or upper set of electrodes.

Figure 4C:
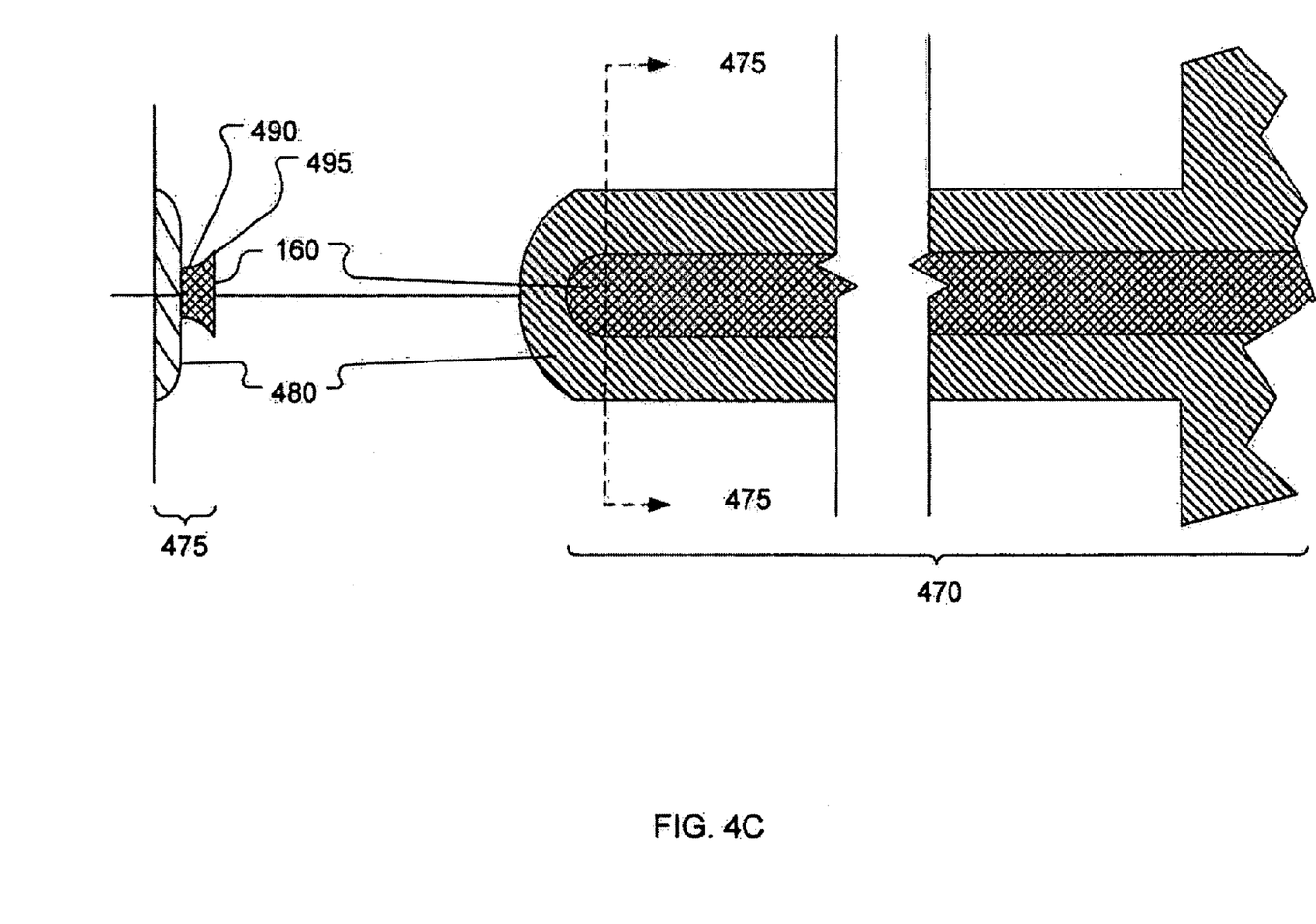
FIG. 4C is a plan view and cross-sectional view of a separating structure on a first layer.

Referring to FIG. 4C, a plan view 470 and a cross-sectional view 475 of one of the separating structures 160 of FIGS. 4A, 4B, 5A, and 5B is shown. Layer 480 is beneath the separating structure 160. The layer 480 can be a pocket layer or a planarizing layer, or even another component of the OLED device that provides a flat surface on which the separating structure 160 is formed. The plan view 470 shows the layer 480 extending past the end of the separating structure 160 thereby preventing the separating structure 160 from contacting the substrate. The cross-sectional view 475 shows the mushroom shape of the separating structure 160 that creates a shadow when conductive material is deposited to form the second electrodes. Conductive material is not deposited under the umbrella of the mushroom shape. The lack of conductive material deposited in the shadow of the separating structure 160 separates the second electrodes from one another. In some implementations, the cross-section of the separating structures 160 has a shape other than a mushroom, such as a triangle, a trapezoid, a tee or an hourglass. In general, a first portion 490 (bottom or proximal portion) of the separating structure 160 closer to the layer 480 than a second portion 495 (top or distal portion) of the separating structure 160 is narrower than the second portion 495 of the separating structure 160 sufficient to provide a shadowing function when the conductive material is applied on the organic layers. The wider profile of the second portion 495 provides the shadowing feature to form a separation between adjacent second electrodes when conductive material is deposited.

The substrate 110 can be any material that can support the organic and conductive material layers thereon. The substrate 110 can be transparent or opaque (e.g., an opaque substrate can be used in top-emitting devices). The substrate 110 can be glass, quartz, silicon, plastic, or stainless steel; in some implementations, the substrate 110 is comprised of thin, flexible glass. The substrate can be transparent. The thickness of the substrate 110 can depend on the material used and on the application of the device. The substrate 110 can be in the form of a sheet or continuous film. A continuous film can be used, for example, for roll-to-roll manufacturing processes that are particularly suited for plastic, metal, and metallized plastic foils.

In some implementations, the first electrodes function as anodes. Anodes are conductive layers which serve as hole-injecting layers and which comprise a material with a work function typically greater than about 4.5 eV. Typical anode materials include metals (such as platinum, gold, palladium, and the like); metal oxides (such as lead oxide, tin oxide, indium tin oxide (ITO), and the like); graphite; doped inorganic semiconductors (such as silicon, germanium, gallium arsenide, and the like); and doped conducting polymers (such as polyaniline, polypyrrole, polythiophene, and the like).

The first electrodes can be transparent, semi-transparent, or opaque to the wavelength of light generated within the device. The thickness of the first electrodes can be from about 10 nm to about 1000 nm, such as from about 50 nm to about 200 nm, and for example, about 100 nm. The first electrode layer can function as anodes. In an alternative configuration, the first electrode layer functions as cathodes. Cathodes are conductive layers which typically serve as electron-injecting layers and which comprise a material with a low work function. The cathodes, rather than the anodes, are deposited on the substrate 110 in the case of, for example, a top-emitting OLED device.

While many materials that can function as a cathode are known to those of skill in the art, a composition that includes aluminum, indium, silver, gold, magnesium, calcium, lithium fluoride, cesium fluoride, sodium fluoride, and barium, or alloys thereof, can be utilized. Aluminum, aluminum alloys, and combinations of magnesium and silver or their alloys can also be utilized. In some embodiments, the second electrodes are fabricated by thermally evaporating in a three layer fashion lithium fluoride, calcium and aluminum in various amounts.

The first electrode layer and second electrode layer, can typically be fabricated using any of the techniques known in the art for depositing thin films, including, for example, vacuum evaporating, sputtering, electron beam depositing, plasma deposition or chemical vapor depositing techniques. The total thickness of the second electrodes can be from about 10 to about 1000 nanometers (nm), such as from about 50 to about 500 nm, for example, from about 100 to about 300 nm.

One or more organic materials are deposited to form one or more organic layers of an organic stack. The organic stack is in contact with the first electrodes. The organic stack typically includes at least a hole injection/anode buffer layer ("HIL/ABL") and emissive layer (EML). If the first electrodes are anodes, then the HIL/ABL is on the first electrodes. Alternatively, if the first electrodes are cathodes, then the EML is on the first electrodes, and the HIL/ABL is on the EML.

The HIL/ABL has good hole conducting properties and is used to effectively inject holes from the first electrodes to the EML. The HIL/ABL is typically made of polymers or small molecule materials. For example, the HIL/ABL can be made of tertiary amine or carbazole derivatives both in their small molecule or their polymer form, conducting polyaniline ("PANI"), or PEDOT:PSS (a solution of poly(3,4-ethylenedioxythiophene, "PEDOT" and polystyrenesulfonic acid, "PSS") available as Baytron P from HC Starck). The HIL/ABL can have a thickness from about 5 nm to about 1000 nm, and is typically from about 50 to about 250 nm.

Other examples of the HIL/ABL include any small molecule materials and the like, such as plasma polymerized fluorocarbon films (CFx) with a thickness between about 0.3 and 3 nm, or copper phthalocyanine (CuPc) films with a thickness between about 10 and 50 nm.

The HIL/ABL can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole transporting and/or buffer material is deposited on the first electrodes and then allowed to dry into a film. The dried film represents the HIL/ABL. Other deposition methods for the HIL/ABL include plasma polymerization (for CFx layers), vacuum deposition, or vapor phase deposition (e.g., for films of CuPc).

For OLEDs, such as the OLED device 400, the EML contains at least one organic material that emits light. These organic light emitting materials generally fall into two categories. The first category of OLEDs, referred to as polymeric light emitting diodes, or PLEDs, utilize polymers as part of the EML. The polymers may be organic or organo-metallic in nature. It is understood that when referring to some devices, the term organic also includes organo-metallic materials. Light-emission in these materials may occur as a result of fluorescence or phosphorescence.

Polymers can be solvated in an organic solvent, such as toluene or xylene, and spun (spin-coated) onto the device, although other deposition methods, such as those described above are possible too. Devices utilizing polymeric active electronic materials in EML are especially preferred.

The light emitting organic polymers in the EML can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, organic polymers can be polyfluorenes, poly-p-phenylenevinylenes that emit white, red, blue, yellow, or green light, and are 2-, or 2,5-substituted poly-p-pheneylenevinylenes or polyspiro polymers.

In addition to polymers, smaller organic molecules that emit by fluorescence or by phosphorescence can serve as a light emitting material residing in the EML. Unlike polymeric materials that are applied as solutions or suspensions, small-molecule light emitting materials are preferably deposited through evaporation, sublimation, or organic vapor phase deposition methods. There are also small molecule materials that can be applied by solution methods. Combinations of PLED materials and smaller organic molecules can also serve as the EML. For example, a PLED may be chemically derivatized with a small organic molecule or simply mixed with a small organic molecule to form EML. Examples of electroluminescent small molecule materials include chelates, such as tris(8-hydroxyquinolate) aluminum ($Alq_3$) and tris(2-phenylpyridine) iridium ($Ir(ppy)_3$), organic materials, such as anthracene, rubrene or triazine, or any metal-chelate compounds or derivatives of any of the organic materials.

In addition to active electronic materials that emit light, the EML can include a material capable of charge transport. Charge transport materials include polymers or small molecules that can transport charges. For example, organic materials such as polythiophene, derivatized polythiophene, oligomeric polythiophene, derivatized oligomeric polythiophene, pentacene, triphenylamine, and triphenyldiamine can be included in the EML.

Polymer organic layers can be applied to the substrate using a variety of techniques, such as ink-jet printing an organic solution or by spin-coating. Alternatively, if small molecule materials are used instead of polymers, the layers can be deposited through evaporation, sublimation, organic vapor phase deposition, or in combination with other deposition techniques. When a layer is deposited on the substrate, the layer may be directly on the substrate or separated from the substrate by other layers, such as the pocket layer or planarization layer described below. An organic solution that is applied can be any fluid or deformable mass capable of flowing under pressure and may include solutions, inks, pastes, emulsions, dispersions, foams, gels, suspensions, and so on. A liquid can contain or be supplemented by further substances which affect the viscosity, contact angle, thickening, affinity, drying, dilution and so on of the deposited drops.

Further, any or all of the layers may be cross-linked or otherwise physically or chemically hardened as desired for stability and maintenance of certain surface properties desirable for deposition of subsequent layers.

Figure 4D:
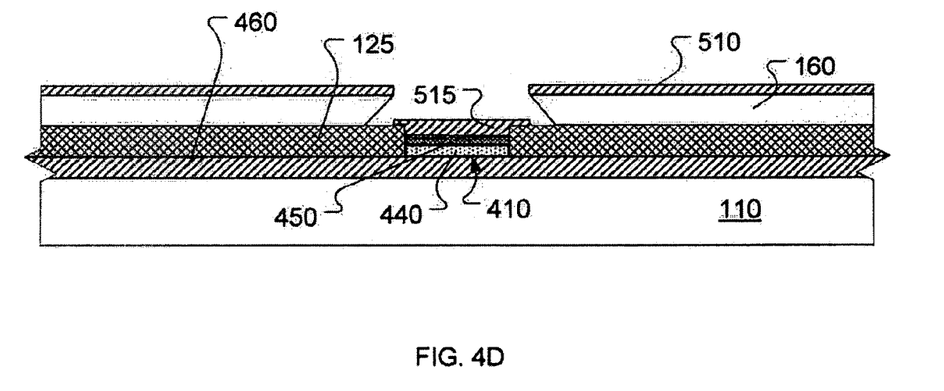
FIG. 4D is a cross-sectional view of one OLED.

Referring to FIG. 4D, conductive material 510, such as metal, is deposited on the organic layers 440, 450 to form the second set of electrodes 515. The second set of electrodes 515, the organic layers 440, 450 and a lower electrode 460 intersect to form an OLED. The separating structures 160 prevent the second set of electrodes from contacting one another by shadowing a region at the base of the separating structures 160 during the deposition of the conductive material 510. Conductive material 510 that is deposited on top of the separating structures 160 may perform no active purpose in the functioning of the OLED device. In some implementations, the conductive material 510 from on top of the separating structures 160 is removed, such as by lift off processes.

In one embodiment, the second electrodes function as cathodes when an electric potential is applied across the first electrodes and the second electrodes. In this embodiment, when an electric potential is applied across the first electrodes, which serve as the anodes, and second electrodes, which serve as the cathodes, photons are released from active electronic layer and pass through first electrodes and the substrate 110.

The pocket layer 125 and separating structures 160 can be formed of a material that is patternable, such as by photolithography. In some implementations, a dielectric layer, such as an oxide, for example, silicon dioxide, can be used for one or both of the pocket layer and the separating structures. The pocket layer 125, or planarizing layer described below, and the separating structures 160 can be formed using photolithographic techniques. Suitable materials for the pocket layer can include photopatternable polymers, such as photoresist, polyimide or polysiloxane, known to one of ordinary skill in the art. The separating structures can be formed from a photoresist, such as a negative photoresist, polyimide or polysiloxane. In some embodiments, the pocket layer 125 is applied on the substrate 110 and patterned to form pockets 410 and fingers 420. In some embodiments, the fingers 420 are joined at their ends, forming an enclosed area around the cathode connectors. In some embodiments, the fingers 420 are linear.

Other layers (not shown) such as a barrier layer and/or getter layer and/or other encapsulation scheme may also be used to protect the electronic device. Such other processing steps and layers are well-known in the art and are not specifically discussed herein.

A similar supporting feature to the fingers 420 of the pocket layer 125 can be applied in other OLED devices. For example, in some OLED devices, a planarizing layer is formed under the separating structures. Planarizing layers are often used in conjunction with OLED devices that have a filter material formed in or on the substrate 110. By modifying or filtering the wavelength of light which can pass through the substrate 110, the color of light emitted by the device can be changed. Thus, the EML does not wholly determine the color emitted by a particular portion of the OLED device. The filter material through which light passes also contributes to the colors of the OLED device pixels.

Figure 5A:
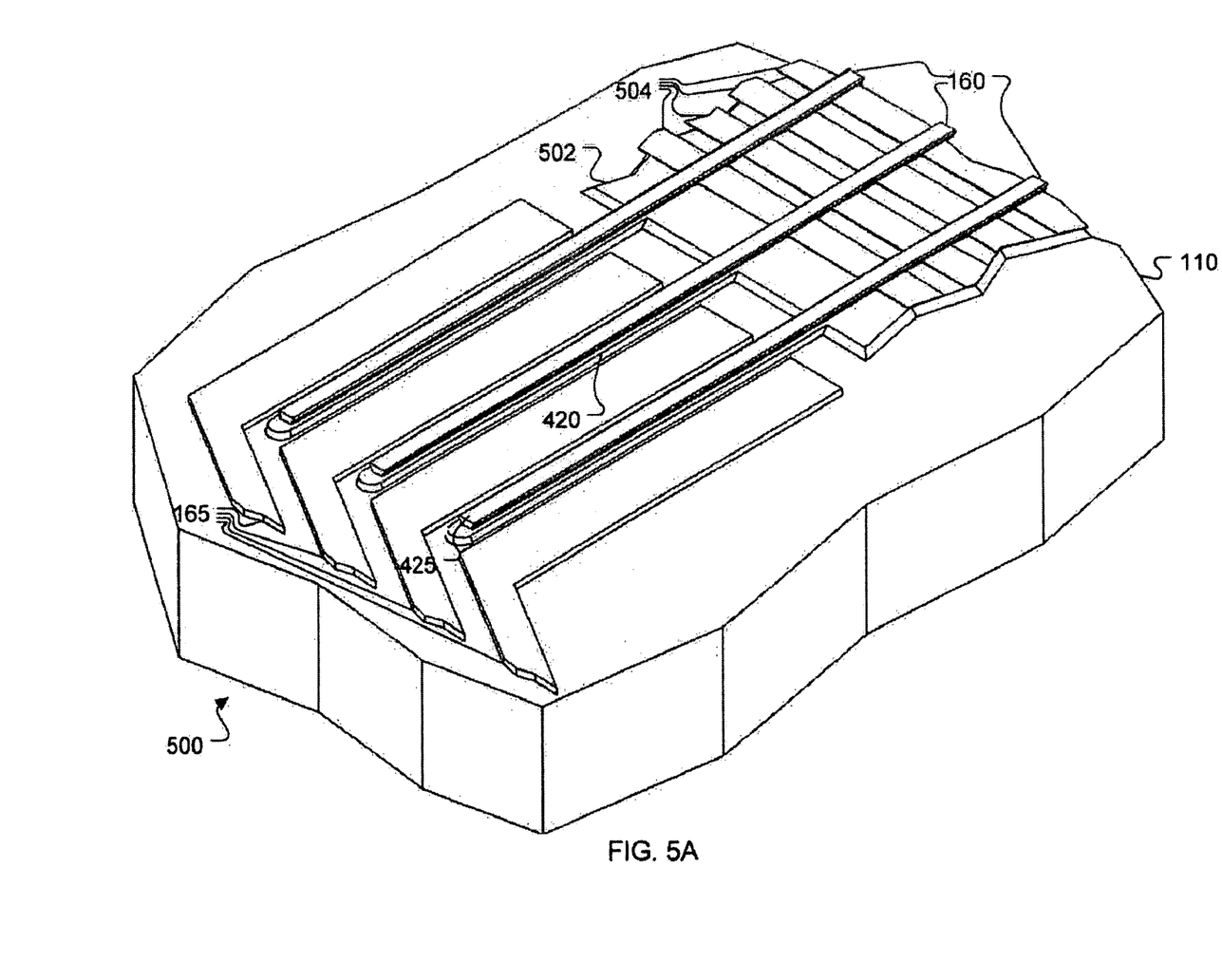
FIG. 5A is a perspective view of an OLED device with a planarizing layer.

Referring to FIG. 5A, an OLED device 500 with a planarizing layer 502 in place of the pocket layer 125 of FIGS. 4A and 4B also has fingers 420 of material supporting the separating structures 160. In this embodiment, the first set of electrodes 504 is located between the planarizing layer 502 and the second set of electrodes. In another implementation, the first set of electrodes 504 are located beneath the planarizing layer 502. The organic layers are located between the planarizing layer 502 and the second set of electrodes. The planarizing layer 502 is formed from a transparent photopatternable polymer, such as acrylate or polyimide. The OLED device 500 contains filter material (not shown) between the planarizing layer 502 and the substrate 110 or in the substrate 110.

Figure 5B:
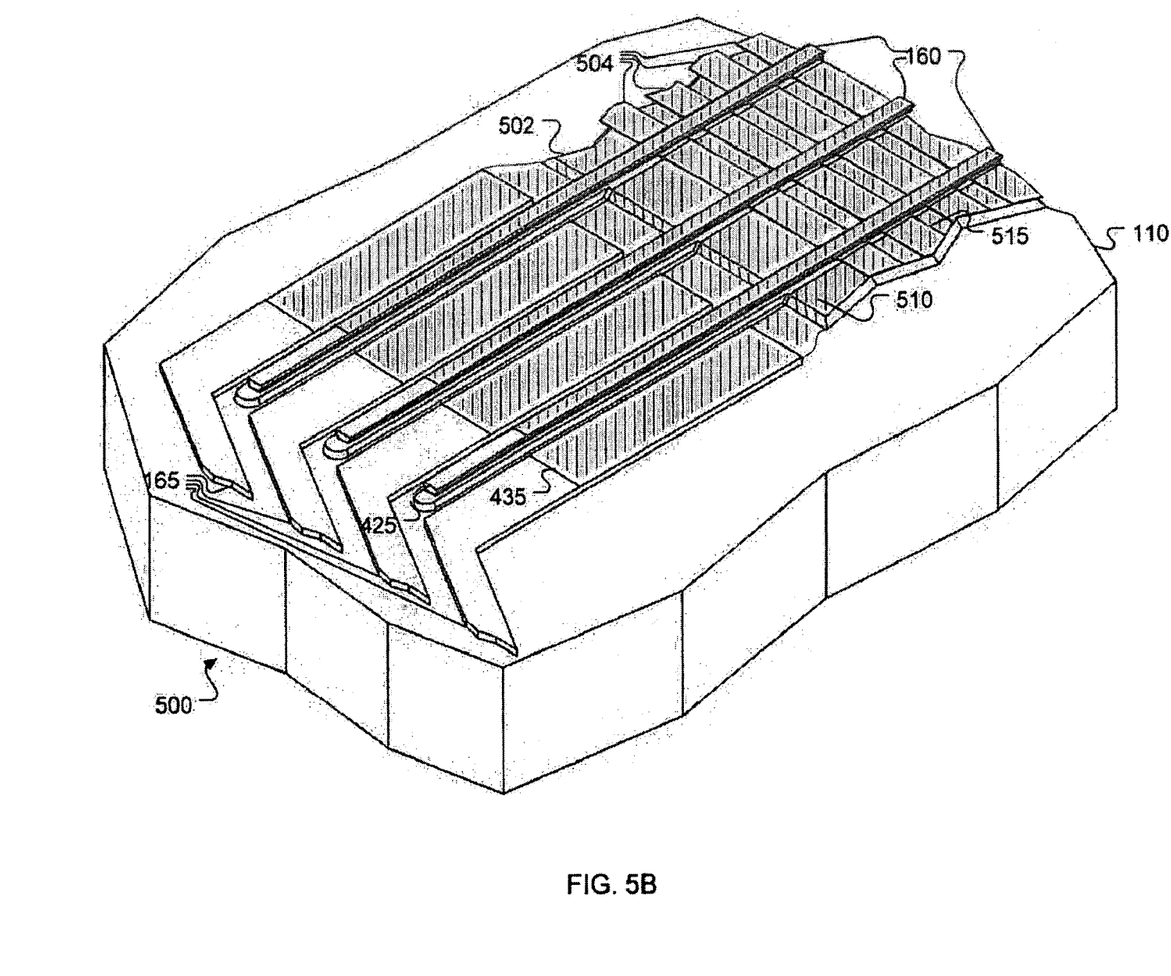
FIG. 5B is a perspective view of an OLED device showing metal deposited to form an upper set of electrodes.

Referring to FIG. 5B, the OLED device 500 of FIG. 5A has conductive material 510 deposited on the organic layers to form the second electrodes. Again, the separating structures 160 divide the deposited conductive material to form individual second electrodes. The ends 425 of the separating structures 160 extend beyond ends 435 of the second electrodes.

Separating structures can provide for a more accurate placement of the electrodes than a shadow mask. Thus, an improved separating structure can be preferred over other methods of forming electrodes, such as etching or using a mask. However, there are potential problems with using a separating structure, particularly if the structure fails to perform the job of separating adjacent electrodes from one another. The OLED device architecture described herein prevents the separating structure from collapsing when the structure is applied to an uneven substrate or a step formed on the substrate because of an edge or uneven portion in a layer underlying the separating structure. That is, extending the planarizing or pocket layer under the separating structure prevents the separating structure from being applied to an uneven surface and collapsing at the area where the uneven surface exists. The separating structure need not make the transition from on top of the planarizing or pocket structure to the substrate. When a conductive layer is applied over the separating structures, there is less likelihood of a deformed area where the conductive material on top of the separating structure can contact the electrodes on either side of the separating structure. Thus, the fingers prevent short circuits at the pocket layer or planarization layer transition edge.

A number of embodiments of the invention have been described. Nevertheless, it will be understood that various modifications may be made without departing from the spirit and scope of the invention. Accordingly, other embodiments are within the scope of the following claims.

What is claimed is:

1. An organic light emitting diode device, comprising:
a substrate;
a plurality of electrode contacts on the substrate;
a first layer on the substrate, the first layer including finger portions, each finger portion being between two adjacent electrode contacts;
a plurality of first electrodes on the substrate extending in a first direction;
one or more organic layers on the plurality of first electrodes;
a plurality of second electrodes on the one or more organic layers, wherein the plurality of second electrodes extend in a second direction different from the first direction and each have at least one end that overlaps with one of the electrode contacts; and
a plurality of separating structures on the first layer and overlapping with the finger portions, wherein a profile of the separating structures is narrower at a portion proximal to the first layer than a portion distal to the first layer and the separating structures extend in the second direction and separate one second electrode from an adjacent second electrode;
wherein the separating structures and the finger portions of the first layer extend beyond ends of the second electrodes.

2. The organic light emitting diode device of claim 1, wherein at least a portion of one separating structure and the first layer extend between two electrode contacts.

3. The organic light emitting diode device of claim 1, wherein:
the first layer includes one or more pockets; and
the one or more organic layers are within the one or more pockets.

4. The organic light emitting diode device of claim 3, wherein:
the first layer is a planarizing layer; and
the one or more organic layers are between the planarizing layer and the plurality of second electrodes.

5. The organic light emitting diode device of claim 4, further comprising filter material between the one or more organic layers and the substrate.

6. The organic light emitting diode device of claim 1, wherein the first layer prevents the plurality of separating structures from having a deformed portion.

7. The organic light emitting diode device of claim 1, wherein the first layer extends at least as far as the plurality of separating structures in the second direction.

8. The organic light emitting diode device of claim 1, wherein the first layer includes a photoresist.

9. The organic light emitting diode device of claim 1, wherein the plurality of separating structures include a photoresist.

10. The organic light emitting diode device of claim 1, wherein the first layer is sandwiched between the substrate and the plurality of first electrodes.

11. The organic light emitting diode device of claim 1, wherein the plurality of first electrodes are sandwiched between the substrate and the first layer.

12. The organic light emitting diode device of claim 1, wherein the separating structures are linear.

13. A method of forming an organic light emitting diode device, comprising:
forming a plurality of electrode contacts on a substrate;
forming a first layer on the substrate, wherein the first layer includes a plurality of finger portions extending in a direction, each finger portion arranged between two adjacent electrode contacts;
forming a plurality of first electrodes on the substrate:
depositing one or more layers of organic material on the plurality of first electrodes;
forming a plurality of separating structures on the first layer, wherein the separating structures have a bottom portion adjacent to the first layer and a top portion that is wider than the bottom portion and each separating structure overlaps with a finger portion; and
forming a plurality of second electrodes over the one or more layers of organic material, the plurality of second electrodes extending in the direction, wherein the forming deposits the plurality of second electrodes such that each second electrode is between two separating structures and overlaps with one of the electrode contacts such that the separating structures and the finger portions extend beyond ends of the plurality of second electrodes.

14. The method of claim 13, wherein forming the first layer includes depositing a photosensitive material and photopatterning the photosensitive material.

15. The method of claim 13, wherein forming the separating structures includes depositing a photosensitive material and photopatterning the photosensitive material.

16. The method of claim 13, wherein:
forming the first layer includes forming a layer having a plurality of pockets; and
depositing one or more layers of organic material includes ink jet printing organic material into the plurality of pockets.

17. The method of claim 13, forming the first layer on a substrate includes forming the first layer over a filter material.

18. The method of claim 17, wherein depositing one or more layers of organic material includes depositing the organic material over the first layer.

19. The method of claim 13, wherein the separating structures extend at least part way between the plurality of electrode contacts.

20. The method of claim 13, wherein forming the first layer and forming the plurality of separating structures form finger portions that are wider than each separating structure.

21. The method of claim 13, wherein forming the plurality of second electrodes includes covering a portion of the substrate with a shadow mask.

22. An organic light emitting diode device, comprising:
a substrate;
a plurality of electrode contacts on the substrate;
a first layer on the substrate, the first layer including finger portions, each finger portion between two adjacent electrode contacts;
a plurality of first electrodes on the substrate;
one or more organic layers on the plurality of first electrodes;
a plurality of second electrodes on the one or more organic layers, each second electrode overlapping with one of the electrode contacts, wherein the plurality of second electrodes extend in a direction;
a plurality of separating structures on the first layer overlapping with the finger portions, wherein a profile of the separating structures is narrower at a portion proximal to the first layer than a portion distal to the first layer and the separating structures extend in the direction and separate one second electrode from an adjacent second electrode; and a metal layer on at least one of the separating structures; wherein at least a portion of a bottom of each separating structure is substantially planar along a length of the separating structure, wherein the portion with the substantially planar bottom and a finger portion of the first layer extend at least past ends of the second electrodes so that the separating layer prevents adjacent second electrodes from contacting one another or a second electrode from contacting the metal layer on at least one of separating structures.

23. The organic light emitting diode of claim 1, wherein the finger portions do not overlap with the electrode contacts.

24. The organic light emitting diode of claim 23, wherein a width of a finger portion is at most 20 microns greater than a width of a separating structure on the finger portion.

25. The organic light emitting diode of claim 1, wherein a region between two adjacent finger portions is devoid of first layer material.

26. The organic light emitting diode of claim 22, wherein the finger portions do not overlap with the electrode contacts.

27. The organic light emitting diode of claim 26, wherein a width of each finger portion is at most 20 microns greater than a width of the separating structure on the finger portion.

28. The organic light emitting diode of claim 22, wherein a region between two adjacent finger portions is devoid of first layer material.

* * * * *